(12) United States Patent
Sekiguchi et al.

(10) Patent No.: US 11,472,748 B2
(45) Date of Patent: Oct. 18, 2022

(54) MANUFACTURING METHOD FOR A MEMBER FOR A SEMICONDUCTOR MANUFACTURING DEVICE AND MEMBER FOR A SEMICONDUCTOR MANUFACTURING DEVICE

(71) Applicant: KYOCERA Corporation, Kyoto (JP)

(72) Inventors: Keiichi Sekiguchi, Satsumasendai (JP); Takeshi Muneishi, Kusatsu (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 16/973,742

(22) PCT Filed: Jun. 27, 2019

(86) PCT No.: PCT/JP2019/025655
§ 371 (c)(1),
(2) Date: Dec. 9, 2020

(87) PCT Pub. No.: WO2020/004564
PCT Pub. Date: Jan. 2, 2020

(65) Prior Publication Data
US 2021/0253486 A1 Aug. 19, 2021

(30) Foreign Application Priority Data
Jun. 28, 2018 (JP) .............................. JP2018-123307

(51) Int. Cl.
*B32B 15/04* (2006.01)
*C04B 37/02* (2006.01)

(52) U.S. Cl.
CPC ...... *C04B 37/023* (2013.01); *C04B 2237/125* (2013.01)

(58) Field of Classification Search
None
See application file for complete search history.

(56) References Cited

U.S. PATENT DOCUMENTS 8,908,349 B2   12/2014  Kida et al.
9,123,835 B2*   9/2015  Shimizu .............. H01L 31/0512
2009/0314526 A1* 12/2009  Nagasawa .............. H05K 3/381
                                                         174/262

(Continued)

FOREIGN PATENT DOCUMENTS

JP     H11-74336 A      3/1999
JP     2002-141404 A    5/2002
JP     2003-224056 A    8/2003

(Continued)

*Primary Examiner* — Seth Dumbris
*Assistant Examiner* — Kim S. Horger
(74) *Attorney, Agent, or Firm* — Procopio, Cory, Hargraves & Savitch LLP

(57) ABSTRACT

In a manufacturing method for a member for a semiconductor manufacturing device, a metal terminal and a ceramic member are joined by using a paste that contains a resin and a metal particle(s), and a metal fine particle(s) that has/have a particle size(s) of 100 nm or less in the metal particle(s) account(s) for 1% by mass or more of 100% by mass of the metal particle(s). A member for a semiconductor manufacturing device includes a metal terminal, a ceramic member, and a joining part that connects the metal terminal and the ceramic member. The joining part contains a metal particle(s).

7 Claims, 2 Drawing Sheets

(56) References Cited

U.S. PATENT DOCUMENTS

2014/0025374 A1\* 1/2014 Lou .................. G10L 15/20
  704/203
2014/0042716 A1 2/2014 Miura et al.

FOREIGN PATENT DOCUMENTS

| JP | 2005-12143 A | 1/2005 |
| JP | 2012-49185 A | 3/2012 |
| JP | 2012-216786 A | 11/2012 |
| JP | 2015-162392 A | 9/2015 |
| WO | 2012/147931 A1 | 11/2012 |

\* cited by examiner

MANUFACTURING METHOD FOR A MEMBER FOR A SEMICONDUCTOR MANUFACTURING DEVICE AND MEMBER FOR A SEMICONDUCTOR MANUFACTURING DEVICE

CROSS-REFERENCE TO RELATED APPLICATION(S)

This application is a national stage application of International Application No. PCT/JP2019/025655 filed on Jun. 27, 2019, which designates the United States, the entire contents of which are herein incorporated by reference, and which is based upon and claims the benefit of priority to Japanese Patent Application No. 2018-123307 filed on Jun. 28, 2018, the entire contents of which are herein incorporated by reference.

FIELD

The present disclosure relates to a manufacturing method for a member for a semiconductor manufacturing device and a member for a semiconductor manufacturing device.

BACKGROUND

For a structure member that is used for a semiconductor manufacturing device (that will be described as a member for a semiconductor manufacturing device below), a ceramic member that is excellent in a mechanical strength thereof has been used widely. Herein, a ceramic member is, for example, a member where a whole thereof is composed of a ceramic(s) or is a member that has an electrically conductive part inside a substrate that is composed of a ceramic(s). Then, joining of a metal terminal to such a ceramic member is executed for a variety of purposes. Hence, for a former, a metal terminal is joined to a ceramic member. Furthermore, for a latter, an electrically conductive part and a metal terminal are joined for a purpose of supplying electrical power to the electrically conductive part in addition to joining of a ceramic member and the metal terminal.

For example, in Patent Literature 1, a structure that uses a gold alloy type joining material is proposed for joining a metal terminal and a ceramic member.

CITATION LIST

Patent Literature

Patent Literature 1: Japanese Patent Application Publication No. 2012-216786

SUMMARY

In a manufacturing method for a member for a semiconductor manufacturing device according to the present disclosure, a metal terminal and a ceramic member are joined by using a paste that contains a resin and a metal particle(s), and a metal fine particle(s) that has/have a particle size(s) of 100 nm or less in the metal particle(s) account(s) for 1% by mass or more of 100% by mass of the metal particle(s).

Furthermore, a member for a semiconductor manufacturing device according to the present disclosure includes a metal terminal, a ceramic member, and a joining part that connects the metal terminal and the ceramic member. Then, the joining part contains a metal particle(s).

DESCRIPTION OF EMBODIMENTS

Figure 1:
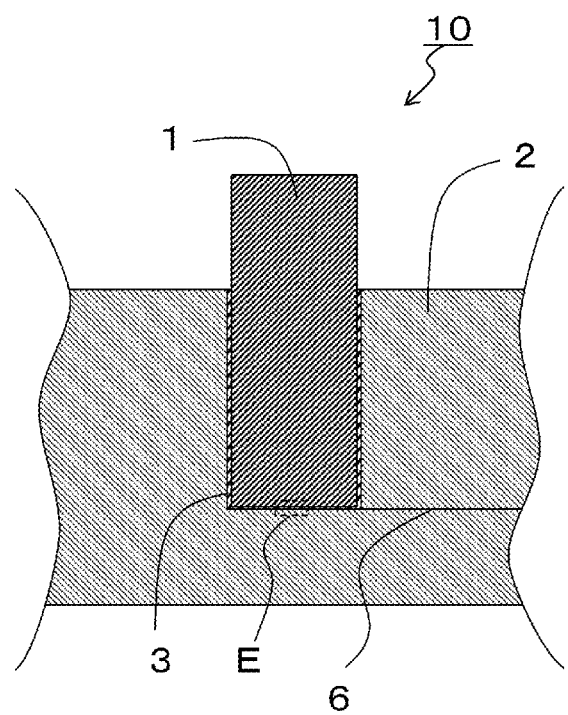
FIG. 1 is a cross-sectional view that illustrates an example of a member for a semiconductor manufacturing device according to the present disclosure.

Hereinafter, a manufacturing method for a member for a semiconductor manufacturing device according to the present disclosure will be explained.

In a manufacturing method for a member for a semiconductor manufacturing device according to the present disclosure, a metal terminal and a ceramic member are joined by using a paste that contains a resin and a metal particle(s) where a metal fine particle(s) that has/have a particle size(s) of 100 nm or less in the metal particle(s) account(s) for 1% by mass or more of 100% by mass of the metal particle(s). Thus, a paste that joins a metal terminal and a ceramic member contains an aforementioned amount of a metal fine particle(s), so that the metal fine particle(s), together with a resin, penetrate(s) into a recess or the like that is present on a surface of the ceramic member and it is possible to join the metal terminal and the ceramic member tightly.

Herein, it is sufficient that a resin is composed of one or more kinds that are selected from an epoxy resin, a cyanate resin, an acryl resin, a maleimide resin, and the like.

Furthermore, it is sufficient that a component that composes a metal fine particle(s) is nickel, copper, gold, silver, ruthenium, rhodium, palladium, osmium, iridium, platinum, or the like. In particular, if a component that composes a metal fine particle(s) is silver, a paste that is inexpensive and is excellent in a thermal conductivity and a corrosion resistance is provided.

Furthermore, it is sufficient that a component that composes a metal terminal is titanium, a stainless one, or the like. Additionally, a metal terminal may be a bush, Irisert, and the like for fixing a ceramic member by using a screw, a nut, or the like, other than a power feeding terminal for feeding electricity.

Furthermore, it is sufficient that a ceramic member is of a ceramic that is provided with a main component that is alumina, zirconia, silicon nitride, aluminum nitride, silicon carbide, boron carbide, cordierite, mullite, or a composite thereof.

Additionally, it is possible to obtain a ceramic member by fabricating a molded body according to a CIP (cold isostatic pressing) method, a lamination method, or the like, firing such a molded body so as to obtain a sintered body, and subsequently applying processing such as polishing or grinding thereto. Furthermore, laser processing or drill processing may be applied to a molded body or a sintered body so as to provide any shape, as needed.

Furthermore, 7 parts by mass or more and 20 parts by mass or less of a solvent per 100 parts by mass of a metal particle(s) may be added to a paste. Thus, a solvent is added to a paste, so that it is possible to improve a fluidity of the paste. Herein, a kind of a solvent may be, for example, an alcohol.

Then, after a paste is applied to or fills any joining place on a ceramic member, a metal terminal is arranged so as to contact the paste as described above and heat treatment is executed at a temperature of 150° C. or higher and 400° C.

or lower, so that it is possible to manufacture a member for a semiconductor manufacturing device.

Additionally, a metal fine particle(s) in a metal particle(s) for a paste in a manufacturing method for a member for a semiconductor manufacturing device according to the present disclosure may account for 50% by mass or less of 100% by mass of the metal particle(s). If such a configuration is satisfied, contraction of a paste that is caused by bonding of metal fine particles to one another at a time of heat treatment is prevented or reduced, and it is possible to join a metal terminal and a ceramic member more tightly.

Furthermore, a paste in a manufacturing method for a member for a semiconductor manufacturing device according to the present disclosure may contain 1 part by mass or more and 20 parts by mass or less of a resin per 100 parts by mass of a metal particle(s). If such a configuration is satisfied, it is possible to join a metal terminal and a ceramic member by not only a metal fine particle(s) but also a resin effectively, and it is possible to join the metal terminal and the ceramic member more tightly.

Furthermore, a metal coarse particle(s) that has/have a particle size(s) of 0.5 μm or greater and 10 μm or less, in a metal particle(s) for a paste in a manufacturing method for a member for a semiconductor manufacturing device according to the present disclosure, may account for 50% by mass or more and 99% by mass or less of 100% by mass of the metal particle(s). If such a configuration is satisfied, a metal coarse particle(s) play(s) a role as an aggregate and a paste is not readily contracted at a time of heat treatment, so that it is possible to join a metal terminal and a ceramic member more tightly.

Furthermore, a ceramic member in a manufacturing method for a member for a semiconductor manufacturing device according to the present disclosure may be provided in such a manner that it has an electrically conductive part where a main component thereof is a noble metal, a metal fine particle(s) in a paste is/are of a noble metal, and the electrically conductive part and a metal terminal are joined by a paste that contains such a metal fine particle(s) of a noble metal.

Herein, a noble metal is gold, silver, ruthenium, rhodium, palladium, osmium, iridium, or platinum. Furthermore, an electrically conductive part where a main component thereof is a noble metal refers to a noble metal accounting for 70% by mass or more of 100% by mass of all components that compose the electrically conductive part.

If such a configuration is satisfied, an electrically conductive part and a metal fine particle(s) are readily bonded, and it is possible to join not only a metal terminal and a ceramic member but also the metal terminal and the electrically conductive part tightly.

Additionally, a thickness of a paste may be 10 μm or greater and 500 μm or less and a thickness of an electrically conductive part may be 3 μm or greater and 40 μm or less.

Furthermore, a thickness of a paste may be identical to a thickness of an electrically conductive part. Furthermore, a thickness of a paste may be greater than a thickness of an electrically conductive part. In a case where it has such a configuration, an electrically conductive part and a paste are readily joined.

Furthermore, a thickness of a paste may be 1 to 80 times as large as a thickness of an electrically conductive part.

Herein, a thickness refers to a length in a direction that is orthogonal to a direction where a metal terminal and a paste are joined. A thickness as described above is defined as being an average value of thicknesses at five points that are measured at equal intervals when a member for a semiconductor manufacturing device 10 is observed at 1000-fold magnification in an SEM image.

Furthermore, a surface that contacts a paste on an electrically conductive part may have a recessed part or a protruding part. In a case where it has such a configuration, an electrically conductive part and a paste are readily joined. This is because a surface area where an electrically conductive part contacts a paste is increased.

Herein, a recessed part may be defined as being a site where an electrically conductive part is recessed with respect to a paste in a cross section that is orthogonal to a direction where the electrically conductive part and the paste are joined. Furthermore, a protruding part may be defined as being a site where an electrically conductive part protrudes with respect to a paste in a cross section that is orthogonal to a direction where a metal terminal and the paste are joined.

Furthermore, it is possible to translate a height of a protruding part into a depth of a recessed part.

Furthermore, a protruding part and a recessed part may have a following size. In a paste, a part A where a thickness from a metal terminal is minimum and a part B that is adjacent to the part A and where a thickness from the metal terminal is maximum are defined. A distance between such a part A and such a part B in a direction that is orthogonal to a direction where a metal terminal and a paste are joined is defined as a height of a protruding part. A height of a protruding part may be 1 μm to 25 μm.

Furthermore, in a paste, a part C where a thickness from a ceramic member is minimum and a part D that is adjacent to the part C and where a thickness from the ceramic member is maximum are defined. A distance between such a part C and such a part D in a direction that is orthogonal to a direction where a metal terminal and a paste are joined is defined as a depth of a recessed part. A depth of a recessed part may be 1 μm to 25 μm.

Additionally, for a fabrication method for a ceramic member that has an electrically conductive part, it is sufficient that, after an electrically conductive part paste that is provided with a main component that is a noble metal is printed on a ceramic green sheet, another ceramic green sheet is laminated thereon so as to provide a molded body and it is fired.

Next, a member for a semiconductor manufacturing device according to the present disclosure will be explained in detail with reference to the drawing(s).

Figure 2:
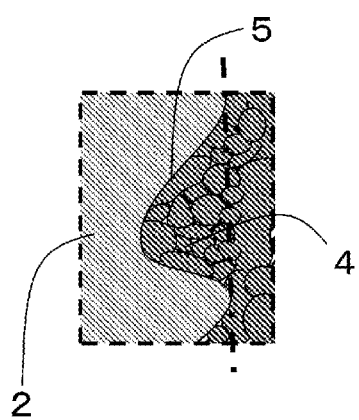
FIG. 2 is an enlarged view of a surface that contacts a joining part on a ceramic member in FIG. 1.
Figure 3:
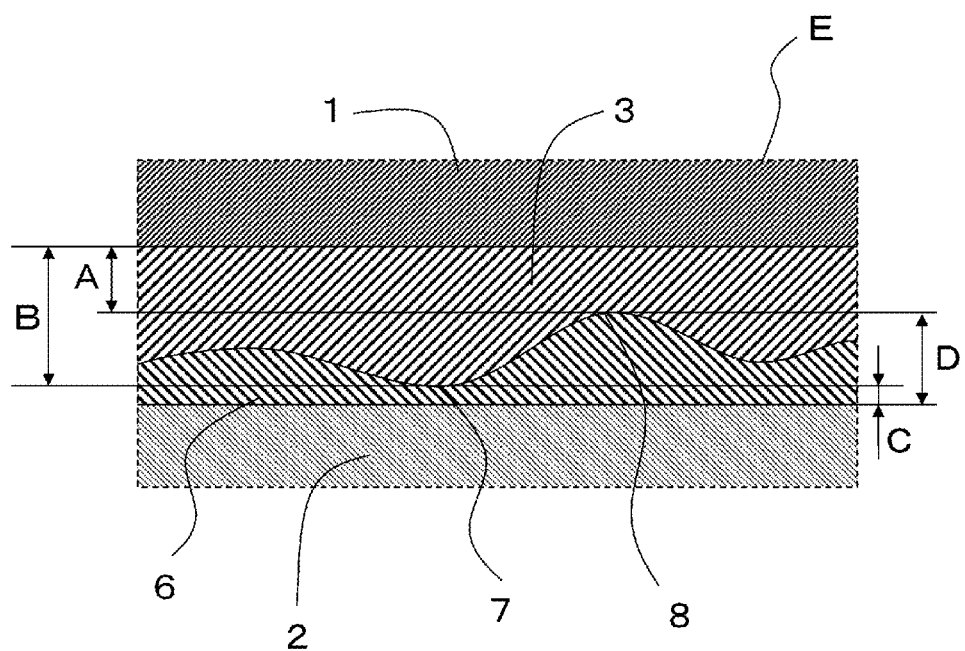
FIG. 3 is an enlarged view of a region E in FIG. 1.

As illustrated in FIG. 1, a member for a semiconductor manufacturing device 10 according to the present disclosure includes a metal terminal 1, a ceramic member 2, and a joining part 3 that connects the metal terminal 1 and the ceramic member 2. Then, as illustrated in FIG. 2, the joining part 3 contains a metal particle(s) 4. As such a configuration is satisfied, the metal terminal 1 and the ceramic member 2 are tightly joined by the joining part 3 that contains the metal particle(s) 4, so that the member for a semiconductor manufacturing device 10 according to the present disclosure has high reliability.

Furthermore, the joining part 3 in the member for a semiconductor manufacturing device 10 according to the present disclosure may contain a resin. If such a configuration is satisfied, expansion or contraction of the joining part 3 that is associated with a temperature change is relaxed by a resin, so that a metal terminal is not readily detached from a ceramic member even if a temperature is changed, and reliability of the member for a semiconductor manufacturing device 10 according to the present disclosure is improved.

Furthermore, in the member for a semiconductor manufacturing device 10 according to the present disclosure, a surface that contacts the joining part 3 on the ceramic member 2 may have a recess 5 as illustrated in FIG. 2. Then, the joining part 3 that corresponds to such a recess 5 may have a metal component that accounts for 90% by surface or more and have the metal particle(s) 4 of 100 nm or less. Herein, the recess 5 is a region on a surface that contacts the joining part 3 on the ceramic member 2, on a side of the ceramic member 2 with respect to a straight line that connects tops of both adjacent protrusions (a dashed-dotted line as illustrated in FIG. 2).

Then, if such a configuration is satisfied, most of the recess 5 is occupied by a metal component and the metal particle(s) 4 of 100 nm or less penetrate(s) into the recess 5, so that a joining strength is improved and reliability of the member for a semiconductor manufacturing device 10 according to the present disclosure is improved.

Additionally, for a confirmation method for the metal particle(s) 4 and a resin, it is sufficient that confirmation is executed by divisionally cutting the member for a semiconductor manufacturing device 10 so as to expose the joining part 3, subsequently observing the joining part 3 by an SEM (a scanning electron microscope), and identifying a component of the joining part 3 by an EDS (an energy dispersive X-ray analysis) that is attached to and provided on the SEM.

Furthermore, in the member for a semiconductor manufacturing device 10 according to the present disclosure, an average separation S between peak tops that is obtained from a roughness curve on a surface that contacts the joining part 3 on the ceramic member 2 may be 5 μm or greater. Herein, such an average separation S between peak tops is specified in JIS B 0601 (1994) and is an index that indicates an average value of a separation between both tops of adjacent peaks.

Then, if such a configuration is satisfied, the metal particle(s) 4 readily penetrate(s) into a space between both adjacent peaks on a surface that contacts the joining part 3 on the ceramic member 2 and a joining strength is improved, so that reliability of the member for a semiconductor manufacturing device 10 according to the present disclosure is improved.

Furthermore, in the member for a semiconductor manufacturing device 10 according to the present disclosure, a maximum cross-section height Rt that is obtained from a roughness curve on a surface that contacts the joining part 3 on the ceramic member 2 may be 2 μm or greater. Herein, such a maximum cross-section height Rt is specified in JIS B 0601 (2013) and is an index that indicates a sum of a maximum peak height and a maximum trough depth in an evaluation length.

Then, if such a configuration is satisfied, the metal particle(s) 4 readily penetrate(s) into a trough on a surface that contacts the joining part 3 on the ceramic member 2 and a joining strength is improved, so that reliability of the member for a semiconductor manufacturing device 10 according to the present disclosure is improved.

Herein, it is sufficient that an average separation S between peak tops and a maximum cross-section height Rt are measured by a following method, based on JIS B 0601 (1994) and JIS B 0601 (2013), respectively. First, a measurement condition(s) is/are set, for example, in such a manner that a measurement length is 1 mm, a cutoff value is 0.25 mm, a probe with a probe radius of 2 μm is used, and a scanning rate is 0.15 mm/sec. Then, it is sufficient that, after the joining part 3 is eliminated by a solvent of an acid or an alkali, measurement is executed at, at least, three or more points on a surface that contacts the joining part 3 on the ceramic member 2 and an average value thereof is obtained.

Furthermore, in the member for a semiconductor manufacturing device 10 according to the present disclosure, the ceramic member 2 may be provided in such a manner that it has an electrically conductive part 6 where a main component thereof is a noble metal, the metal particle(s) 4 in the joining part 3 is of a noble metal, and it has the joining part 3 that contains the metal particle(s) 4 of such a noble metal, between the electrically conductive part 6 and the metal terminal 1, as illustrated in FIG. 1.

If such a configuration is satisfied, not only the metal terminal 1 and the ceramic member 2 but also the metal terminal 1 and the electrically conductive part 6 are tightly joined by the joining part 3, so that reliability of the member for a semiconductor manufacturing device 10 according to the present disclosure is improved.

Additionally, a thickness of the joining part 3 may be 10 μm or greater and 500 μm or less and a thickness of the electrically conductive part 6 may be 3 μm or greater and 40 μm or less.

Furthermore, a thickness of the joining part 3 may be identical to a thickness of the electrically conductive part 6. Furthermore, a thickness of the joining part 3 may be greater than a thickness of the electrically conductive part 6. In a case where it has such a configuration, the electrically conductive part 6 and the joining part 3 are readily joined.

Furthermore, a thickness of the joining part 3 may be 1 to 80 times as large as a thickness of the electrically conductive part 6.

Herein, a thickness refers to a length in a direction that is orthogonal to a direction where the metal terminal 1 and the joining part 3 are joined. A thickness as described above is defined as being an average value of thicknesses at five points that are measured at equal intervals when the member for a semiconductor manufacturing device 10 is observed at 1000-fold magnification in an SEM image.

Furthermore, a surface that contacts the joining part 3 on the electrically conductive part 6 may have a recessed part 7 or a protruding part 8. In a case where it has such a configuration, the electrically conductive part 6 and the joining part 3 are readily joined. This is because a surface area where the electrically conductive part 6 contacts the joining part 3 is increased.

Herein, the recessed part 7 may be defined as being a site where the electrically conductive part 6 is recessed with respect to the joining part 3 on a cross section that is orthogonal to a direction where the electrically conductive part 6 and the joining part 3 are joined. Furthermore, the protruding part 8 may be defined as being a site where the electrically conductive part 6 protrudes with respect to the joining part 3 on a cross section that is orthogonal to a direction where the electrically conductive part 6 and the joining part 3 are joined.

Furthermore, it is possible to translate a height of the protruding part 8 into a depth of the recessed part 7.

Furthermore, the protruding part 8 and the recessed part 7 may have a following size(s). In the joining part 3, a part A where a thickness from the metal terminal 1 is minimum and a part B that is adjacent to the part A and where a thickness from the metal terminal 1 is maximum are defined. A distance between such a part A and such a part B in a direction that is orthogonal to a direction where the metal terminal 1 and the joining part 3 are joined is defined as a height of the protruding part 8. A height of the protruding part 8 may be 1 μm to 25 μm.

Furthermore, in the electrically conductive part 6, a part C where a thickness from the ceramic member 2 is minimum and a part D that is adjacent to the part C and where a thickness from the ceramic member 2 is maximum are defined. A distance between such a part C and such a part D in a direction that is orthogonal to a direction where the metal terminal 1 and the joining part 3 are joined is defined as a depth of the recessed part 7. A depth of the recessed part 7 may be 1 μm to 25 μm.

It is possible for a person(s) skilled in the art to readily derive an additional effect(s) and/or variation(s). Hence, a broader aspect(s) of the present invention is/are not limited to a specific detail(s) and a representative embodiment(s) as illustrated and described above. Therefore, various modifications are possible without departing from the spirit or scope of a general inventive concept that is defined by the appended claim(s) and an equivalent(s) thereof.

REFERENCE SIGNS LIST

1: metal terminal
2: ceramic member
3: joining part
4: metal particle
5: recess
6: electrically conductive part
7: recessed part
8: protruding part
10: member for semiconductor manufacturing device

The invention claimed is:

1. A member for a semiconductor manufacturing device, comprising:
   a metal terminal;
   a ceramic member; and
   a joining part that connects the metal terminal and the ceramic member, wherein
   the joining part contains metal particle(s),
   wherein the ceramic member includes a surface that contacts the joining part, the surface including a roughness curve with
   an average separation S between peak tops that is 5 μm or greater.

2. The member for a semiconductor manufacturing device according to claim 1, wherein the joining part contains resin.

3. The member for a semiconductor manufacturing device according to claim 1, wherein the surface includes a recess; and the joining part includes a portion that corresponds to the recess, and the portion includes a metal component that accounts for 90% by surface or more and metal particle(s) of 100 nm or less.

4. The member for a semiconductor manufacturing device according to claim 1, wherein the roughness curves include a maximum cross-section height Rt that is 2 μm or greater.

5. The member for a semiconductor manufacturing device according to claim 1, wherein the ceramic member includes an electrically conductive part with a main component that is noble metal; and the metal particle(s) in the joining part is noble metal.

6. The member for a semiconductor manufacturing device according to claim 5, wherein the electrically conductive part includes a surface with at least one of a recessed part and a protruding part that contacts the joining part.

7. The member for a semiconductor manufacturing device according to claim 5, wherein the joining part includes a thickness and the electrically conductive part includes a thickness, and the thickness of the joining part is equal to or greater than the thickness of the electrically conductive part.

* * * * *